US010993319B1

United States Patent
Ma et al.

(10) Patent No.: US 10,993,319 B1
(45) Date of Patent: Apr. 27, 2021

(54) CHIP PACKAGE AND CIRCUIT BOARD THEREOF

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/939,243

(22) Filed: Jul. 27, 2020

(30) Foreign Application Priority Data

Feb. 17, 2020 (TW) ................................. 109105036

(51) Int. Cl.
*H05K 1/02* (2006.01)
*H05K 1/18* (2006.01)
*H05K 3/28* (2006.01)

(52) U.S. Cl.
CPC .......... *H05K 1/0296* (2013.01); *H05K 1/181* (2013.01); *H05K 3/282* (2013.01); *H05K 2201/02* (2013.01); *H05K 2201/099* (2013.01)

(58) Field of Classification Search
CPC ...... H05K 1/0296; H05K 3/282; H05K 1/181; H05K 2201/099; H05K 2201/02; H05K 2201/0989; H05K 3/3452
See application file for complete search history.

(56) References Cited

U.S. PATENT DOCUMENTS

| 5,647,123 A * | 7/1997 | Greenwood | .......... H01L 21/563 174/260 |
| 7,102,239 B2* | 9/2006 | Pu | ...................... H01L 23/49816 257/678 |
| 7,564,140 B2* | 7/2009 | Lee | ........................ H01L 21/563 257/778 |
| 2002/0050397 A1* | 5/2002 | Sakamoto | ............... H01L 24/32 174/250 |
| 2004/0063332 A1* | 4/2004 | Seko | ...................... H01L 21/563 438/734 |
| 2005/0218513 A1* | 10/2005 | Seko | ...................... H01L 23/544 257/734 |
| 2007/0045870 A1* | 3/2007 | Kuramochi | ........... H01L 21/563 257/782 |
| 2009/0283317 A1* | 11/2009 | Ozawa | .............. H01L 23/49822 174/267 |

(Continued)

FOREIGN PATENT DOCUMENTS

| TW | 201220994 A1 | 5/2012 |
| TW | 201607985 A | 3/2016 |

OTHER PUBLICATIONS

Taiwanese Office Action dated Jul. 10, 2020 for Taiwanese Patent Application No. 109105036, 3 pages.

*Primary Examiner* — Steven T Sawyer
(74) *Attorney, Agent, or Firm* — Demian K. Jackson; Jackson IPG PLLC

(57) ABSTRACT

A chip package includes a circuit board, a chip and an underfill. A solder resist layer formed on the circuit board is modified in edge profile so as to reduce required amount of the underfill. The fewer underfill is still enough to be filled between the circuit board and the chip, and still can cover circuit lines that are not covered by the solder resist layer to protect the circuit lines from oxidation.

15 Claims, 5 Drawing Sheets

(56) References Cited

U.S. PATENT DOCUMENTS

| | | | |
|---|---|---|---|
| 2009/0294978 A1* | 12/2009 | Ota | H01L 23/49816 |
| | | | 257/773 |
| 2010/0327437 A1* | 12/2010 | Nakahama | H05K 3/303 |
| | | | 257/737 |
| 2012/0267778 A1* | 10/2012 | Asami | H01L 21/4853 |
| | | | 257/737 |
| 2016/0315028 A1* | 10/2016 | Chou | H01L 24/94 |

* cited by examiner

CHIP PACKAGE AND CIRCUIT BOARD THEREOF

FIELD OF THE INVENTION

This invention relates to a chip package and its circuit board, and more particularly to a chip package and circuit board which require a lower quantity of underfill owing to a solder resist layer with modified profile.

BACKGROUND OF THE INVENTION

Conventionally, circuit lines on a circuit board are covered by a solder mask, and inner leads of the circuit lines are exposed, not covered by the solder mask. In order to decrease the defect rate, a large amount of underfill material is required to be filled between a chip and the circuit board so as to cover a corner space formed next to adjacent edges of the solder mask. However, the underfill material may overflow to cover the solder mask to cause defective products when the corner space is filled with too much underfill material.

In addition, miniaturized chip package has a lower capacity of underfill material such that the fewer underfill material may be not sufficient to fill the corner space.

SUMMARY

One object of the present invention is to modify profile of a solder resist layer to decrease required quantity of an underfill filled between a chip and a substrate, and the fewer underfill is still sufficient for covering circuit lines that are not covered by the solder resist layer. Consequently, the circuit lines are protected from oxidation.

A circuit board of the present invention includes a substrate, a plurality of circuit lines and a solder resist layer. A chip mounting area, an underfill covering area and a circuit forming area are defined on a surface of the substrate, the underfill covering area is located between the chip mounting area and the circuit forming area. The chip mounting area at least has a first edge and a second edge that are adjacent to one another. The circuit lines are formed on the surface and each includes an inner lead, a first line fragment and a second line fragment. The first line fragment is located between the inner lead and the second line fragment, the inner lead is located on the chip mounting area, the first line fragment is located on the underfill covering area, and the second line fragment is located on the circuit forming area. The solder resist layer covers the circuit forming area and the second line fragments and exposes the chip mounting area, the underfill covering area, the inner leads and the first line fragments. The solder resist layer at least has a third edge and a fourth edge that are adjacent to one another, the third edge corresponds to the first edge, and the fourth edge corresponds to the second edge. A first axis extends along the first edge to intersect the fourth edge at a first intersection point, a second axis extends along the second edge to intersect the third edge at a second intersection point, the first axis intersects the second axis at a third intersection point, a third axis extends along the third edge, a fourth axis extends along the fourth edge to intersect the third axis at a fourth intersection point. A first sub-area is defined by connecting the first, second and third intersection points and is a part of the underfill covering area and is located at a corner of the underfill covering area. A second sub-area is defined by connecting the first, second and fourth intersection points. The solder resist layer covers the second sub-area and the solder resist layer located on the second sub-area has a second surface area more than or equal to a first surface area of the first sub-area.

A chip package of the present invention includes the circuit board as mentioned above, a chip and an underfill. The chip is mounted on the chip mounting area and includes a plurality of bumps, each of the bumps is connected to the inner lead of each of the circuit lines. The underfill is filled between the substrate and the chip, covers the underfill covering area and the first line fragment of each of the circuit lines, and contacts the solder resist layer.

Another chip package of the present invention includes the circuit board as mentioned above, a chip and an underfill. The circuit board further includes at least one reinforcement element having a first portion and a second portion, the first portion is located on the first sub-area of the underfill covering area, the second portion is located on the circuit forming area and covered by the solder resist layer. The chip is mounted on the chip mounting area and includes a plurality bumps, each of the bumps is connected to the inner lead of each of the circuit lines. The underfill is filled between the substrate and the chip, covers the underfill covering area, the first line fragment of each of the circuit lines and the first portion of the reinforcement element, and contacts the solder resist layer.

The solder resist layer of the present invention has a modified profile so as to reduce the required quantity of the underfill, and the fewer underfill still can cover the circuit lines that are not covered by the solder resist layer to protect the circuit lines from oxidation.

DETAILED DESCRIPTION OF THE INVENTION

Figure 1:
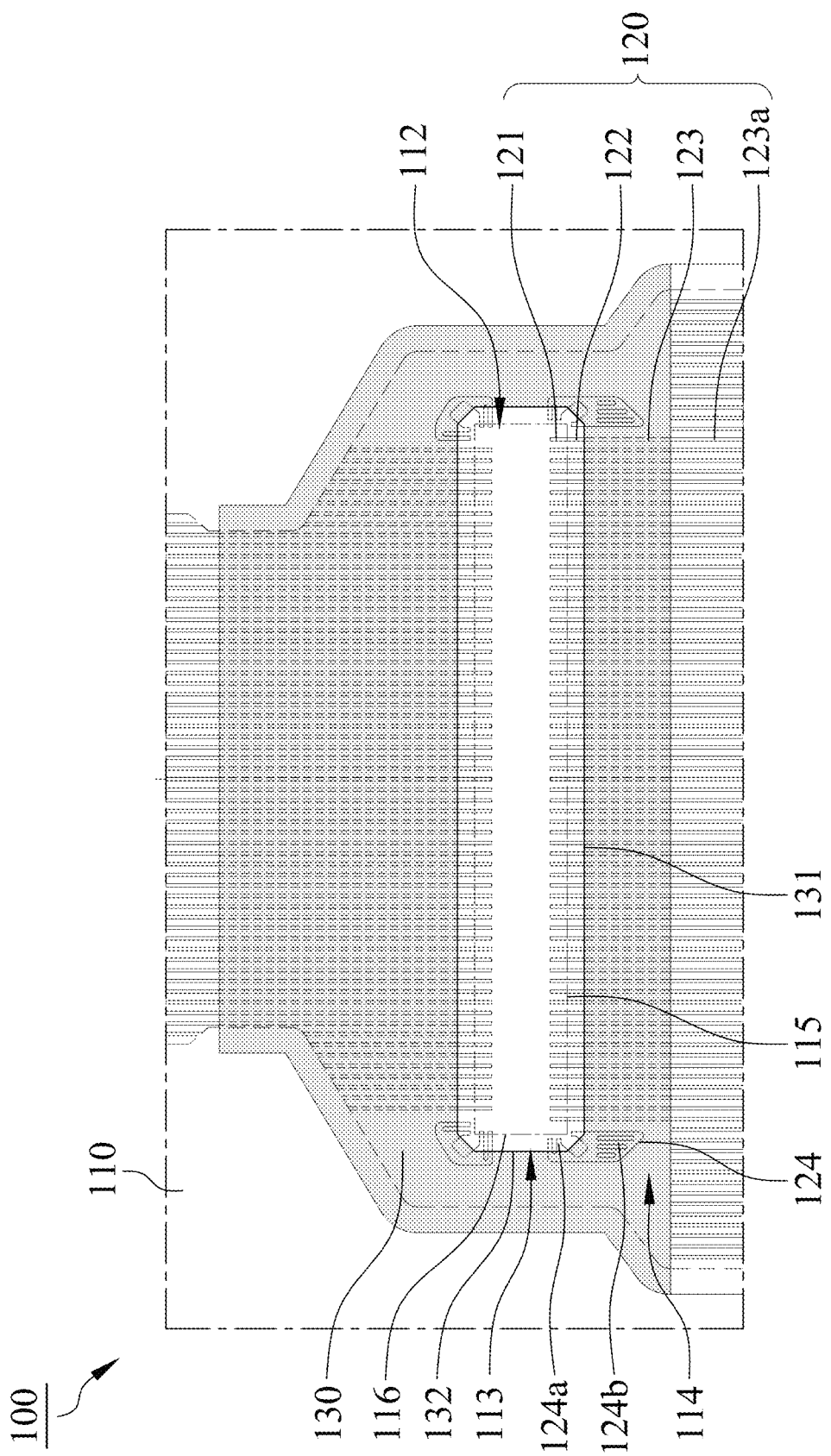
FIG. 1 is a top view diagram illustrating a circuit board in accordance with a first embodiment of the present invention.

A circuit board 100 and a chip package 10 represent in FIGS. 1 and 2 and FIGS. 4 and 5, respectively. The chip package 10 includes the circuit board 100, a chip 200 and an underfill 300. The circuit board 100 includes a substrate 110, a plurality of circuit lines 120 and a solder resist layer 130. The substrate 110 is, but not limited to, made of polyimide (PI). A chip mounting area 112, an underfill covering area 113 and a circuit forming area 114 are defined on a surface 111 of the substrate 110. The underfill covering area 113 is located between the chip mounting area 112 and the circuit forming area 114, the chip mounting area 112 is provided for the installation of the chip 200. In the first embodiment, the chip mounting area 112 has two first edges 115 and two second edges 116 which are adjacent to the first edges 115.

Figure 2:
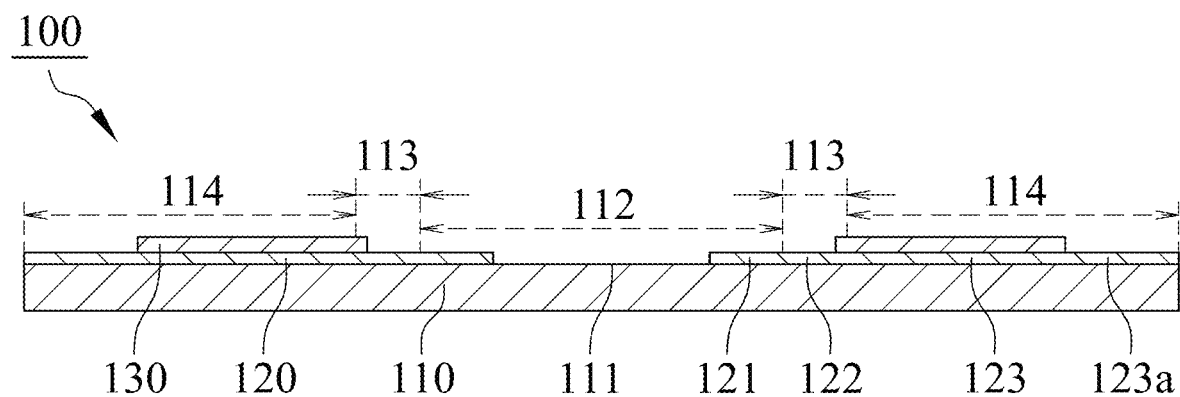
FIG. 2, is a cross-section view diagram illustrating the circuit board in accordance with the first embodiment of the present invention.
Figure 3:
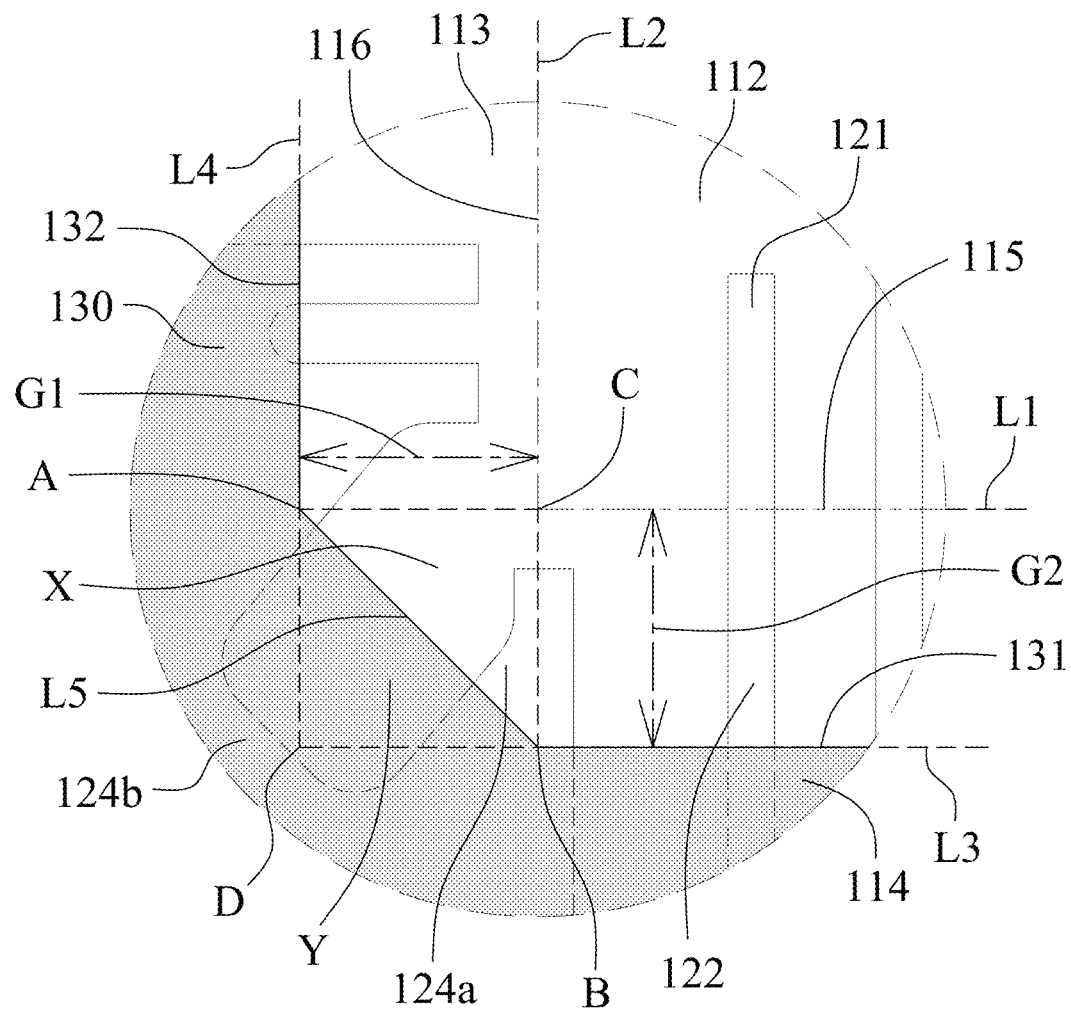
FIG. 3 is a partial enlarged diagram of FIG. 1.

With reference to FIGS. 1 to 3, the circuit lines 120 are formed on the surface 111 and each includes an inner lead 121, a first line fragment 122 and a second line fragment 123. The first line fragment 122 is located between the inner lead 121 and the second line fragment 123, the inner lead 121 is located on the chip mounting area 112, the first line fragment 122 is located on the underfill covering area 113, and the second line fragment 123 is located on the circuit forming area 114. The second line fragment 123 has an outer lead 123a. In the first embodiment, the circuit board 100 further includes at least on reinforcement element 124 which is, but not limited to, made of the same material as the circuit lines 120. The reinforcement element 124 includes a first portion 124a and a second portion 124b, the first portion 124a is located on the underfill covering area 113, and the second portion 124b is located on the circuit forming area 114. The reinforcement element 124 is provided to enhance the stiffness of the substrate 110 to prevent the deformation of the substrate 110 when it is heated or pressed. The first portion 124a on the underfill covering area 113 can be bonded to bump of the chip 200 so as to protect the chip 200 from breaking while connecting with the circuit board 100.

With reference to FIGS. 1 to 3, the solder resist layer 130 covers the circuit forming area 114, the second line fragments 123 and the second portion 124b of the reinforcement element 124, and exposes (not cover) the chip mounting area 112, the underfill covering area 113, the inner leads 121, the first line fragments 122, the outer leads 123a and the first portion 124a of the reinforcement element 124.

With reference to FIGS. 1 to 3, the solder resist layer 130 of the first embodiment at least has two third edges 131 and two fourth edges 132 which are adjacent to the third edges 131. The third edges 131 correspond to the first edges 115, and the fourth edges 132 correspond to the second edges 116. A first axis L1 extends along the first edge 115 to intersect the fourth edge 132 at a first intersection point A, a second axis L2 extends along the second edge 116 to intersect the third edge 131 at a second intersection point B, the first axis L1 intersects the second axis L2 at a third intersection point C. In the first embodiment, the third intersection point C is also the intersection point of the first edge 115 and the second edge 116. A third axis L3 extends along the third edge 131, a fourth axis L4 extends along the fourth edge 132 to intersect the third axis L3 at a fourth intersection point D. A first sub-area X is defined by connecting the first intersection point A, the second intersection point B and the third intersection point C, and a second sub-area Y is defined by connecting the first intersection point A, the second intersection point B and the fourth intersection point D. The first sub-area X is a part of the underfill covering area 113 and located at the corner of the underfill covering area 113, the first portion 124a of the reinforcement element 124 is located on the first sub-area X. The solder resist layer 130 covers the second sub-area Y, and the solder resist layer 130 located on the second sub-area Y has a second surface area that is greater than or equal to a first surface area of the first sub-area X.

With reference to FIGS. 1 and 3, in the first embodiment, the solder resist layer 130 located on the second sub-area Y does not cross a fifth axis L5 connecting the first intersection point A and the second intersection point B. A first distance G1 exists between the first intersection point A and the third intersection point C, and a second distance G2 exists between the second intersection point B and the third intersection point C. In the first embodiment, the first distance G1 is equal to the second distance G2, and the second surface area of the second sub-area Y is equal to the first surface area of the first sub-area X.

Figure 6:
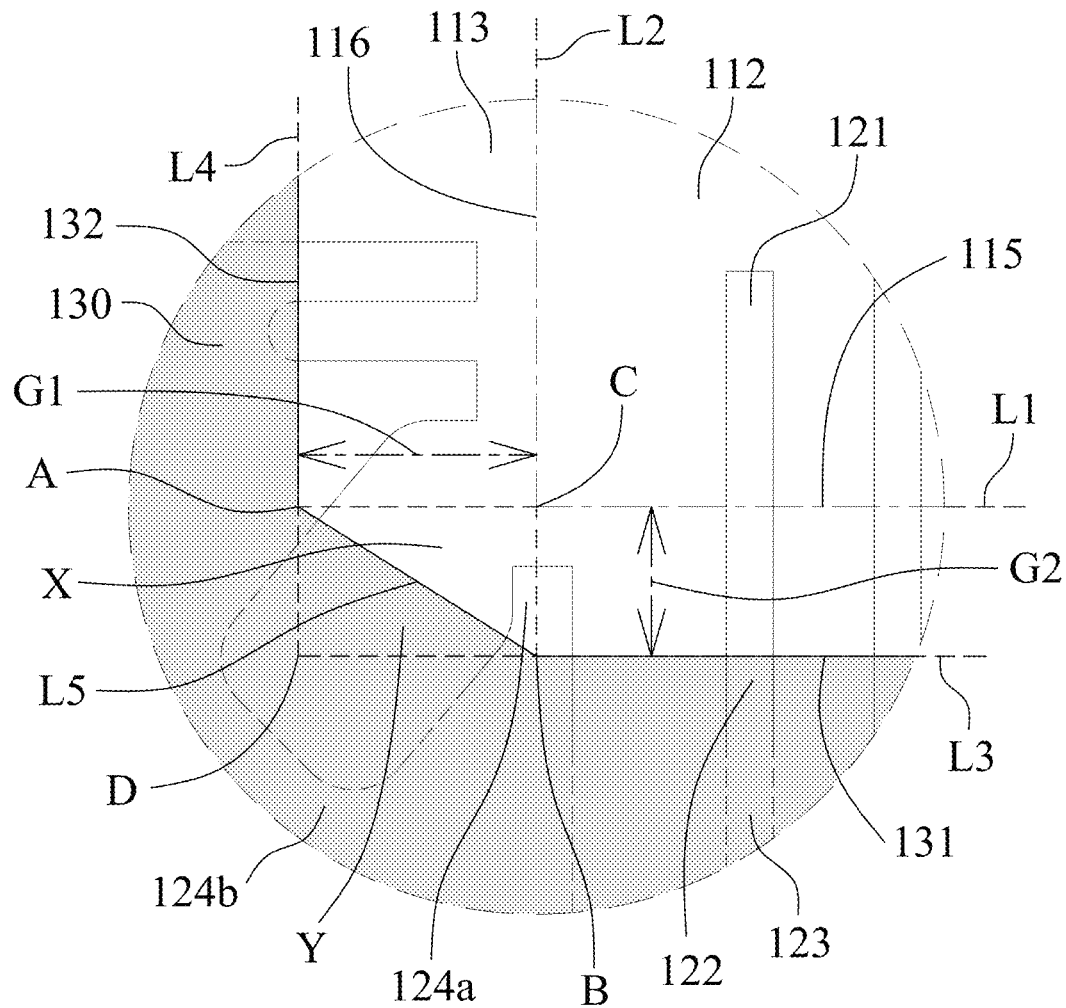
FIG. 6 is a partial schematic diagram illustrating a circuit board in accordance with a second embodiment of the present invention.

FIG. 6 shows a second embodiment of the present invention, the difference to the first embodiment is that the first distance G1 is longer than the second distance G2 in the second embodiment. As same as the first embodiment, the second surface area of the second sub-area Y is equal to the first surface area of the first sub-area X when the solder resist layer 130 located on the second sub-area Y covers the fifth axis L5 but not cross the fifth axis L5.

Figure 7:
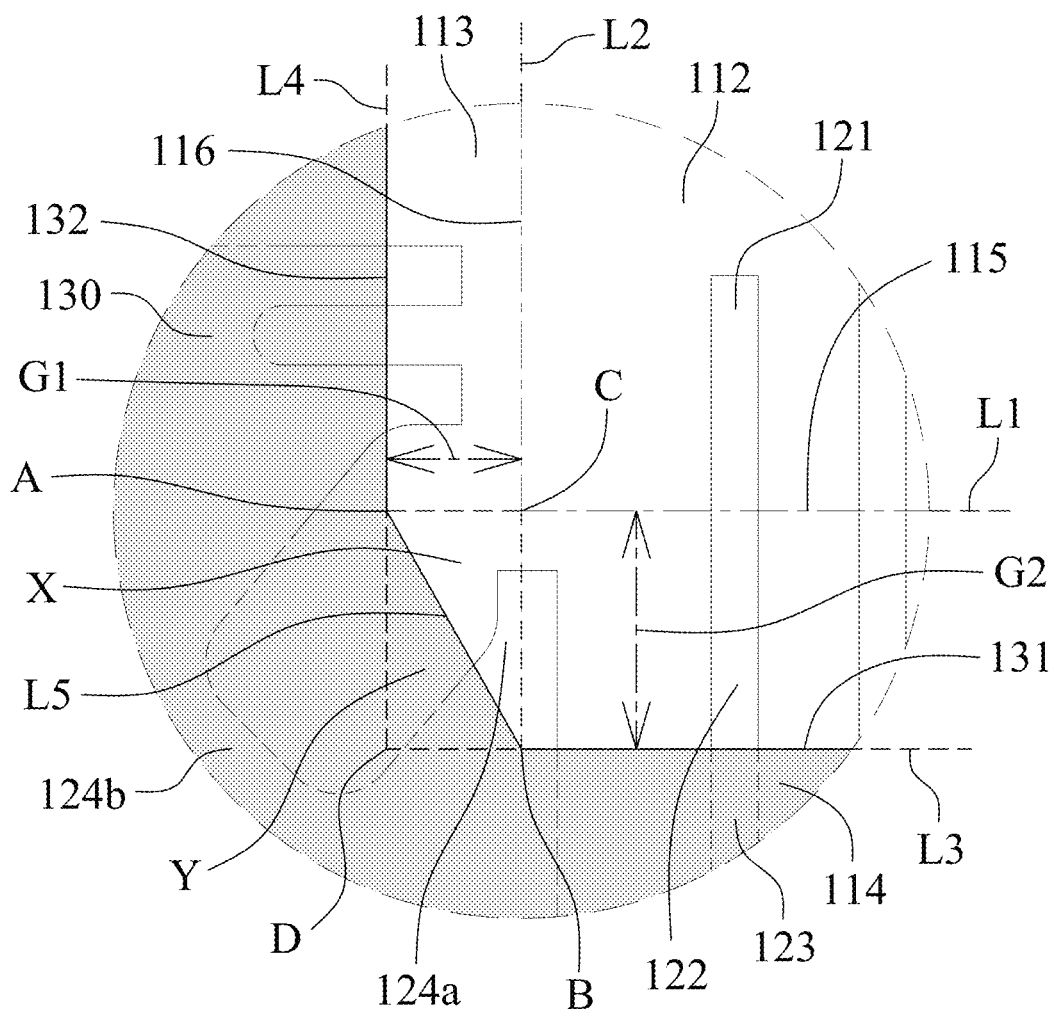
FIG. 7 is a partial schematic diagram illustrating the circuit board in accordance with the third embodiment of the present invention.

A third embodiment of the present invention is shown in FIG. 7, and the difference to the first embodiment is that the first distance G1 is shorter than the second distance G2 in the third embodiment. Similarly, the second surface area of the second sub-area Y is equal to the first surface area of the first sub-area X when the solder resist layer 130 covers the fifth axis L5 and not cross the fifth axis L5.

Figure 4:
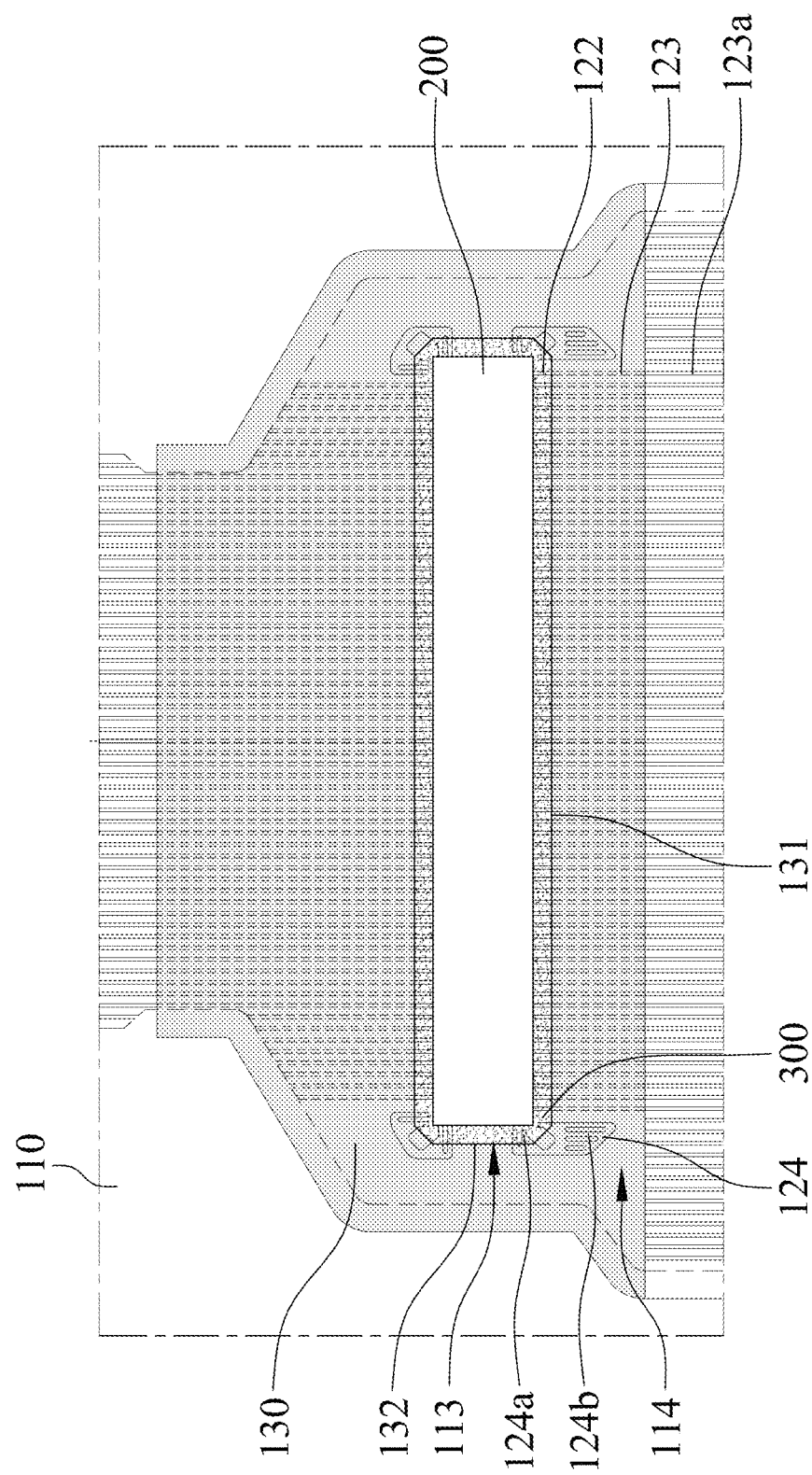
FIG. 4 is a top view diagram illustrating a chip package in accordance with one embodiment of the present invention.
Figure 5:
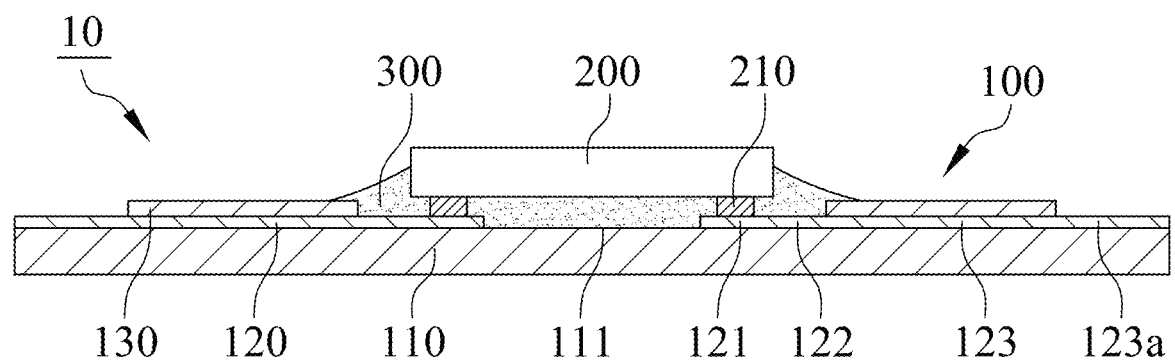
FIG. 5 is a cross-section view diagram illustrating the chip package in accordance with one embodiment of the present invention.

With reference to FIGS. 2, 4 and 5, the chip 200 of the chip package 10 includes a plurality of bumps 210. In a bonding process, the chip 200 is mounted on the chip mounting area 112 to allow the bumps 210 to bond with the inner leads 121, then the underfill 300 is filled between the substrate 110 and the chip 200 to cover the underfill covering area 113 and the first line fragments 122. If there is the reinforcement element 124 on the circuit board 100, the underfill 300 also covers the first portion 124a of the reinforcement element 124 that is not covered by the solder resist layer 130 and touches the solder resist layer 130. Preferably, the underfill 300 covers the solder resist layer 130 located on the second sub-area Y, and a third surface area of the underfill 300, that covers the solder resist layer 130 located on the second sub-area Y, is less than or equal to the second surface area of the second sub-area Y.

Because of the profile of the solder resist layer 300, the required amount of the underfill 300 filled between the circuit board 100 and the chip 200 can be reduced, and the fewer underfill 300 still can cover the circuit lines 120 that are not covered by the solder resist layer 130 to protect the circuit lines 120 from oxidation.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board, comprising:
    a substrate having a surface, a chip mounting area, an underfill covering area and a circuit forming area are defined on the surface, the underfill covering area is located between the chip mounting area and the circuit forming area, the chip mounting area at least has a first edge and a second edge that are adjacent to one another;
    a plurality of circuit lines formed on the surface and each including an inner lead, a first line fragment and a second line fragment, the first line fragment is located between the inner lead and the second line fragment, the inner lead is located on the chip mounting area, the first line fragment is located on the underfill covering area, and the second line fragment is located on the circuit forming area; and
    a solder resist layer covering the circuit forming area and the second line fragment of each of the plurality of circuit lines and exposing the chip mounting area, the underfill covering area, the inner lead and the first line fragment of each of the plurality of circuit lines, the solder resist layer at least has a third edge and a fourth edge that are adjacent to one another, the third edge corresponds to the first edge, the fourth edge corresponds to the second edge, a first axis extends along the first edge to intersect the fourth edge at a first intersection point, a second axis extends along the second edge to intersect the third edge at a second intersection point, the first axis intersects the second axis at a third intersection point, a third axis extends along the third edge, a fourth axis extends along the fourth edge to intersect the third axis at a fourth intersection point, a first sub-area is defined by connecting the first, second and third intersection points and is a part of the underfill covering area and is located at a corner of the underfill covering area, a second sub-area is defined by connecting the first, second and fourth intersection points, the solder resist layer covers the second sub-area, and the solder resist layer located on the second sub-area has a second surface area greater than or equal to a first surface area of the first sub-area.

2. The circuit board in accordance with claim 1, wherein the second surface area is equal to the first surface area.

3. The circuit board in accordance with claim 1, wherein the solder resist layer does not cross a fifth axis that connects the first and second intersection points.

4. The circuit board in accordance with claim 1, wherein a first distance exists between the first and third intersection points, a second distance exists between the second and third intersection points, and the first distance is more than or equal to the second distance.

5. The circuit board in accordance with claim 1, wherein a first distance exists between the first and third intersection points, a second distance exists between the second and third intersection points, and the first distance is less than the second distance.

6. The circuit board in accordance with claim 1 further comprising at least one reinforcement element, the at least one reinforcement element includes a first portion and a second portion, the first portion is located on the first sub-area of the underfill covering area, the second portion is located on the circuit forming area and covered by the solder resist layer.

7. A chip package, comprising:
a circuit board including a substrate, a plurality of circuit lines and a solder resist layer,
the substrate has a surface, a chip mounting area, an underfill covering area and a circuit forming area are defined on the surface, the underfill covering area is located between the chip mounting area and the circuit forming area, the chip mounting area at least has a first edge and a second edge that are adjacent to one another,
the plurality of circuit lines are formed on the surface and each includes an inner lead, a first line fragment and a second line fragment, the first line fragment is located between the inner lead and the second line fragment, the inner lead is located on the chip mounting area, the first line fragment is located on the underfill covering area, and the second line fragment is located on the circuit forming area,
the solder resist layer covers the circuit forming area and the second line fragment of each of the plurality of circuit lines and exposes the chip mounting area, the underfill covering area, the inner lead and the first line fragment of each of the plurality of circuit lines, the solder resist layer at least has a third edge and a fourth edge that are adjacent to one another, the third edge corresponds to the first edge, the fourth edge corresponds to the second edge, a first axis extends along the first edge to intersect the fourth edge at a first intersection point, a second axis extends along the second edge to intersect the third edge at a second intersection point, the first axis intersects the second axis at a third intersection point, a third axis extends along the third edge, a fourth axis extends along the fourth edge to intersect the third axis at a fourth intersection point, a first sub-area is defined by connecting the first, second and third intersection points and is a part of the underfill covering area and is located at a corner of the underfill covering area, a second sub-area is defined by connecting the first, second and fourth intersection points, the solder resist layer covers the second sub-area, and the solder resist layer located on the second sub-area has a second surface area greater than or equal to a first surface area of the first sub-area;
a chip mounted on the chip mounting area and including a plurality of bumps, each of the plurality of bumps is connected to the inner lead of each of the plurality of circuit lines; and
an underfill filled between the substrate and the chip, the underfill covers the underfill covering area and the first line fragment of each of the plurality of circuit lines and contacts the solder resist layer.

8. The chip package in accordance with claim 7, wherein the second surface area is equal to the first surface area.

9. The chip package in accordance with claim 7, wherein the solder resist layer does not cross a fifth axis that connects the first and second intersection points.

10. The chip package in accordance with claim 7, wherein a first distance exists between the first and third intersection points, a second distance exists between the second and third intersection points, and the first distance is more than or equal to the second distance.

11. The chip package in accordance with claim 7, wherein a first distance exists between the first and third intersection points, a second distance exists between the second and third intersection points, and the first distance is less than the second distance.

12. The chip package in accordance with claim 7, wherein the circuit board further includes at least one reinforcement element, the at least one reinforcement element includes a first portion and a second portion, the first portion is located on the first sub-area of the underfill covering area, the second portion is located on the circuit forming area and covered by the solder resist layer.

13. The chip package in accordance with claim 12, wherein the underfill covers the first portion of the at least one reinforcement element.

14. The chip package in accordance with claim 13, wherein the underfill covers the solder resist layer located on the second sub-area, and the underfill covering the solder resist layer located on the second sub-area has a third surface area less than or equal to the second surface area of the second sub-area.

15. The chip package in accordance with claim 7, wherein the underfill covers the solder resist layer located on the second sub-area, and the underfill covering the solder resist layer located on the second sub-area has a third surface area less than or equal to the second surface area of the second sub-area.

* * * * *